(12) United States Patent
Pei

(10) Patent No.: US 9,074,280 B2
(45) Date of Patent: Jul. 7, 2015

(54) PLASMA FILM DEPOSITION DEVICE

(75) Inventor: Shao-Kai Pei, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 615 days.

(21) Appl. No.: 13/486,131

(22) Filed: Jun. 1, 2012

(65) Prior Publication Data

US 2013/0160710 A1    Jun. 27, 2013

(30) Foreign Application Priority Data

Dec. 26, 2011   (TW) .............................. 100148722 A

(51) Int. Cl.
| | | |
|---|---|---|
| *C23C 16/00* | (2006.01) | |
| *C23C 14/22* | (2006.01) | |
| *C23C 14/32* | (2006.01) | |
| *H01J 37/32* | (2006.01) | |

(52) U.S. Cl.
CPC .............. *C23C 14/228* (2013.01); *C23C 14/32* (2013.01); *H01J 37/3244* (2013.01); *H01J 37/32669* (2013.01)

(58) Field of Classification Search
CPC ......................... H01J 37/3244; H01J 37/32623
USPC ...................................................... 118/723 R
See application file for complete search history.

(56) References Cited

U.S. PATENT DOCUMENTS 5,579,705 A * 12/1996 Suzuki et al. ................. 110/185
2010/0255658 A1* 10/2010 Aggarwal et al. ............. 438/478

* cited by examiner

*Primary Examiner* — Keath Chen
(74) *Attorney, Agent, or Firm* — Novak Druce Connolly Bove + Quigg LLP

(57) ABSTRACT

A plasma film deposition device includes a film deposition chamber, a plasma generator within the deposition chamber, a plurality of gas carrier boards adjustably mounted to the plasma generator, a gas providing system, and a rotating support bracket. The gas providing system provides working gas and protective gas. The rotating support bracket is assembled within the film deposition chamber, and is aligned with the plasma generator, for holding workpieces in certain orientations. The plasma generator ionizes the working gas into high-temperature plasma, and sprays the high-temperature plasma toward the rotating support bracket to form plasma films on the workpieces. A plasma jet area is defined between the rotating support bracket and the plasma generator, the gas carrier boards eject the protective gas toward the plasma jet area thereby adjusting the shape of the plasma jet area.

14 Claims, 5 Drawing Sheets

PLASMA FILM DEPOSITION DEVICE

BACKGROUND

1. Technical Field

The present disclosure generally relates to film deposition devices, and particularly to a plasma film deposition device.

2. Description of Related Art

A plasma film deposition device may control the shape and area of its plasma jet by adjusting a current to the coil within the plasma film deposition device. However, such method for controlling the plasma jet area shape of the plasma film deposition device in use is easily influenced or impacted by the degree of vacuum, the gas flow rate and other factors, and thus, it is hard to stably control the shape of the plasma jet area.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure.

DETAILED DESCRIPTION

Figure 1:
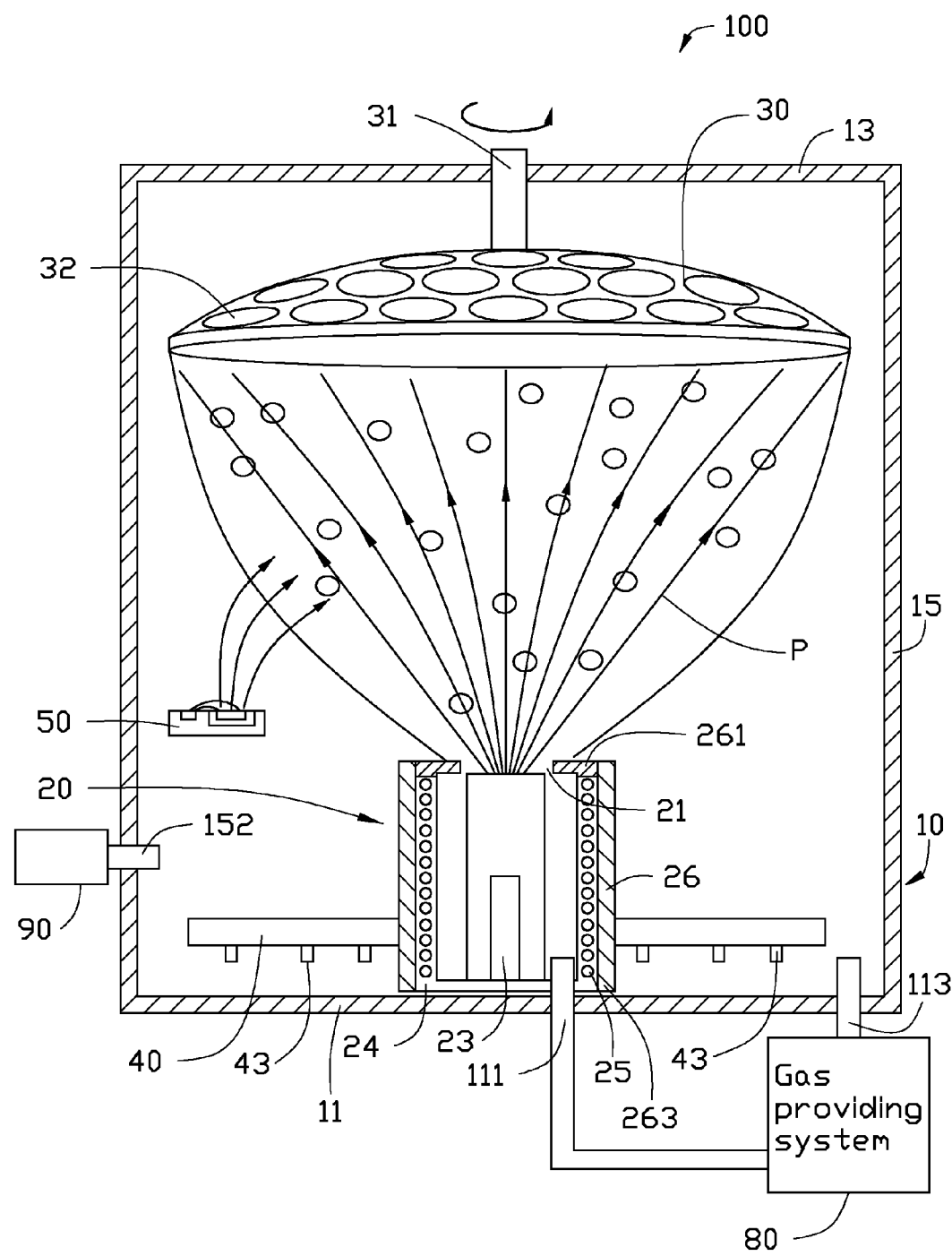
FIG. 1 shows a schematic view of an embodiment of a plasma film deposition device in a first working state, wherein, the plasma film deposition device includes a film deposition chamber, a plasma generator, a rotating support bracket, a plurality of gas carrier boards and a film material provider.
Figure 2:
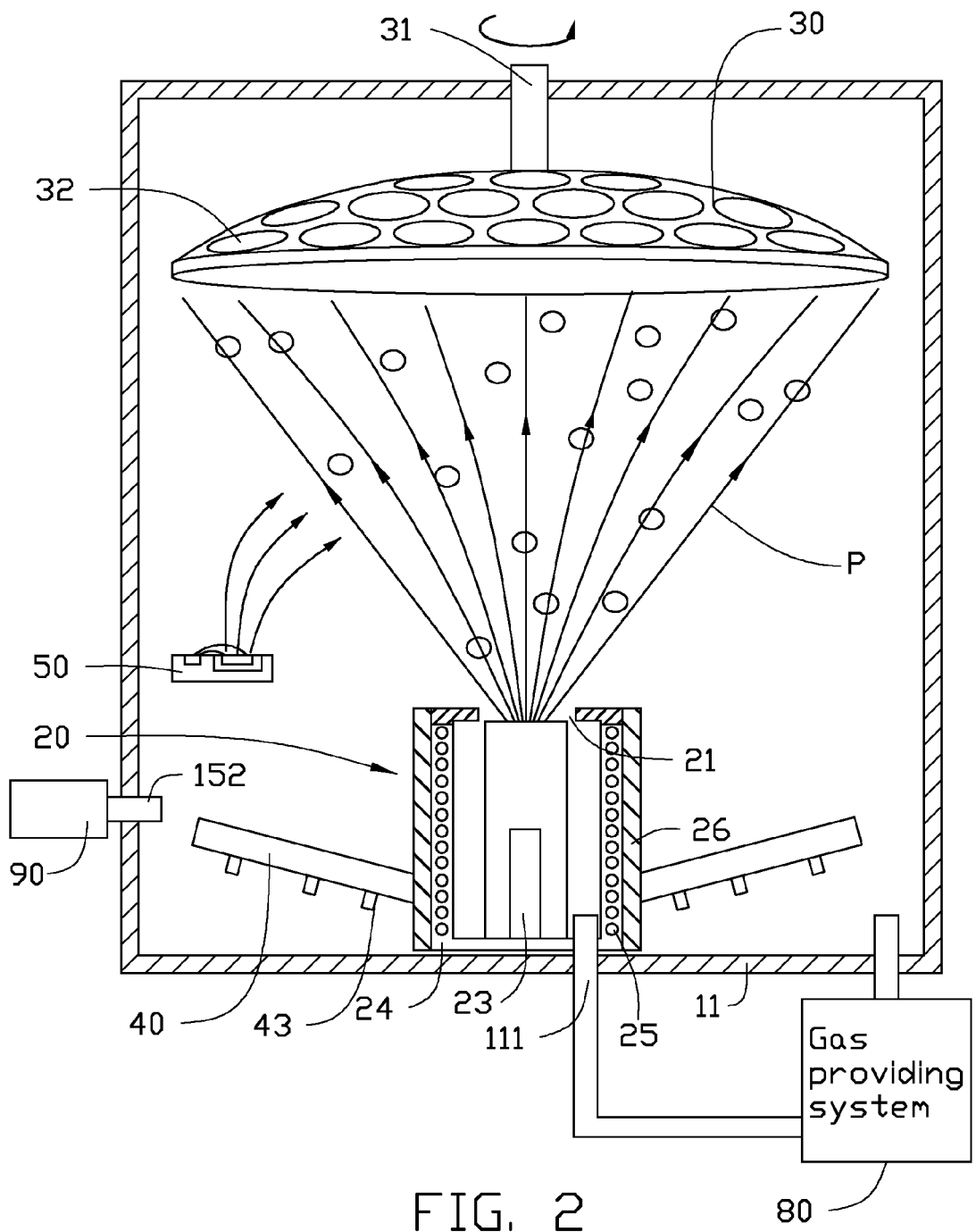
FIG. 2 is similar to FIG. 1 and shows a schematic view of the plasma film deposition device in a second working state.

Referring to FIGS. 1 and 2, an embodiment of a plasma film deposition device 100 is shown. The plasma film deposition device 100 includes a film deposition chamber 10, a plasma generator 20, a rotating support bracket 30, a plurality of gas carrier boards 40 and a film material provider 50.

The film deposition chamber 10 includes a bottom wall 11, a top wall 13 opposite to the bottom wall 11, and a peripheral wall 15. The bottom wall 11 defines a first gas inlet 111 at a substantially middle portion of the bottom wall 11, and a second gas inlet 113 adjacent to the peripheral wall 15. The first gas inlet 111 and the second gas inlet 113 are connected to an gas providing system 80 located outsides the film deposition chamber 10, the gas providing system 80 provides working gas and protective gas into the film deposition chamber 10 via the first gas inlet 111 and the second gas inlet 113. The peripheral wall 15 defines a vacuum pumping port 152. The vacuum pumping port 152 is connected to an outer vacuum extractor 90, for creating a vacuum in the film deposition chamber 10, before a film deposition process.

The plasma generator 20 is assembled within the film deposition chamber 10 and further electrically connected to an outer electric power supply (not shown). The first gas inlet 111 communicates with the plasma generator 20. The plasma generator 20 is capable of ionizing the working gas input from the first gas inlet 111 into a high-temperature plasma, and spraying the high-temperature plasma toward the rotating support bracket 30. The plasma generator 20 includes a housing 26, a cathode 23, an anode 24 and a magnetic field coil 25. The housing 26 includes a top end 261 facing the top wall 13 of the film deposition chamber 10, and a bottom end 263 opposite to the top end 261. The bottom end 263 of the housing 26 is mounted on the bottom wall 11 of the film deposition chamber 10 and communicates with the first gas inlet 111, such that, the working gas can be input into the housing 26 of the plasma generator 20 by the first gas inlet 111. The top end 261 of the housing 26 defines a spraying opening 21 facing the top wall 13. The cathode 23, the anode 24, and the magnetic field coil 25 are assembled within the housing 26. The cathode 23 and the anode 24 are electronically connected to the outer electric power supply for heating and ionizing the working gas. The magnetic field coil 25 is for driving and accelerating the ionized high-temperature plasma and finally ejecting the plasma from the spraying opening 21, as a high-temperature plasma jet.

The rotating support bracket 30 is rotatably assembled within the film deposition chamber 10, and is positioned above and aligning with the plasma generator 20, for supporting and holding a plurality of positioned workpieces (not shown). A plasma jet area P is defined between the rotating support bracket 30 and the plasma generator 20. In the illustrated embodiment, the rotating support bracket 30 is dome-shaped and is assembled to the top wall 13 by a rotating shaft 31. The rotating shaft 31 is coaxial with the plasma generator 20. The rotating support bracket 30 defines a plurality of mounting holes 32 for receiving the plurality of workpieces.

Figure 3:
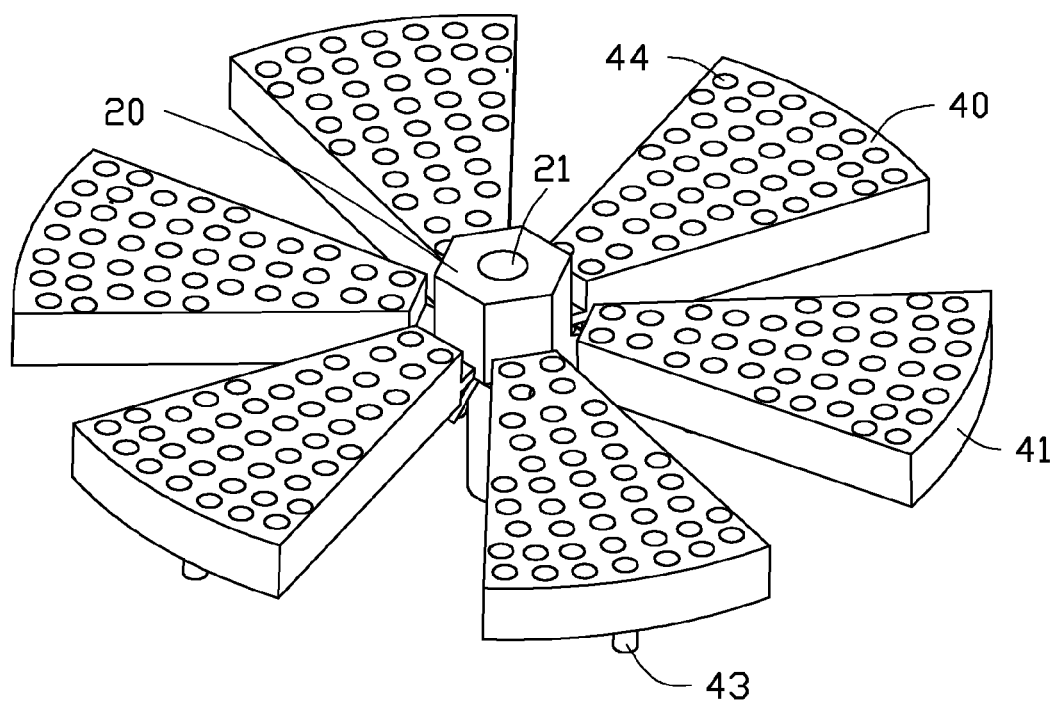
FIG. 3 shows an assembled, isometric view of the plasma generator and the plurality of gas carrier boards of FIG. 1.
Figure 4:
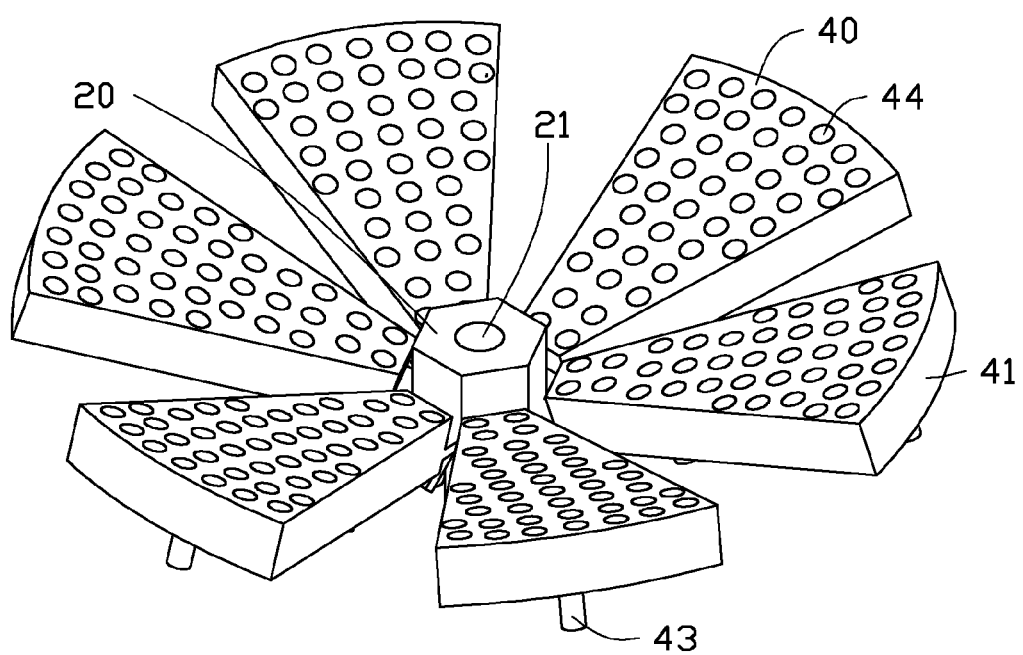
FIG. 4 shows an assembled, isometric view of the plasma generator and the gas carrier boards of FIG. 2.

Also referring to FIGS. 3 and 4, the plurality of gas carrier boards 40 are evenly and adjustably mounted to a peripheral wall of the plasma generator 20 thereby circumferentially surrounding the plasma generator 20. The gas carrier boards 40 are further connected with the second gas inlet 113 by tubes (not shown), such that the protective gas can be input into the film deposition chamber 10, and ejected toward the plasma jet area P by gas carrier boards 40. A shape of the plasma jet area P can be adjusted by rotating the gas carrier boards 40. Each gas carrier board 40 is capable of being tilted up and down, of rotating up and down on the plasma generator 20, and remaining at a preset angle relative to the plasma generator 20, according to an actual need. In use, the plurality of gas carrier boards 40 form a constant angle with the plasma generator 20, and the angle between the gas carrier board 40 and the plasma generator 20 depends on different parameters of the film required, such as density, thickness, and bonding adhesion.

Figure 5:
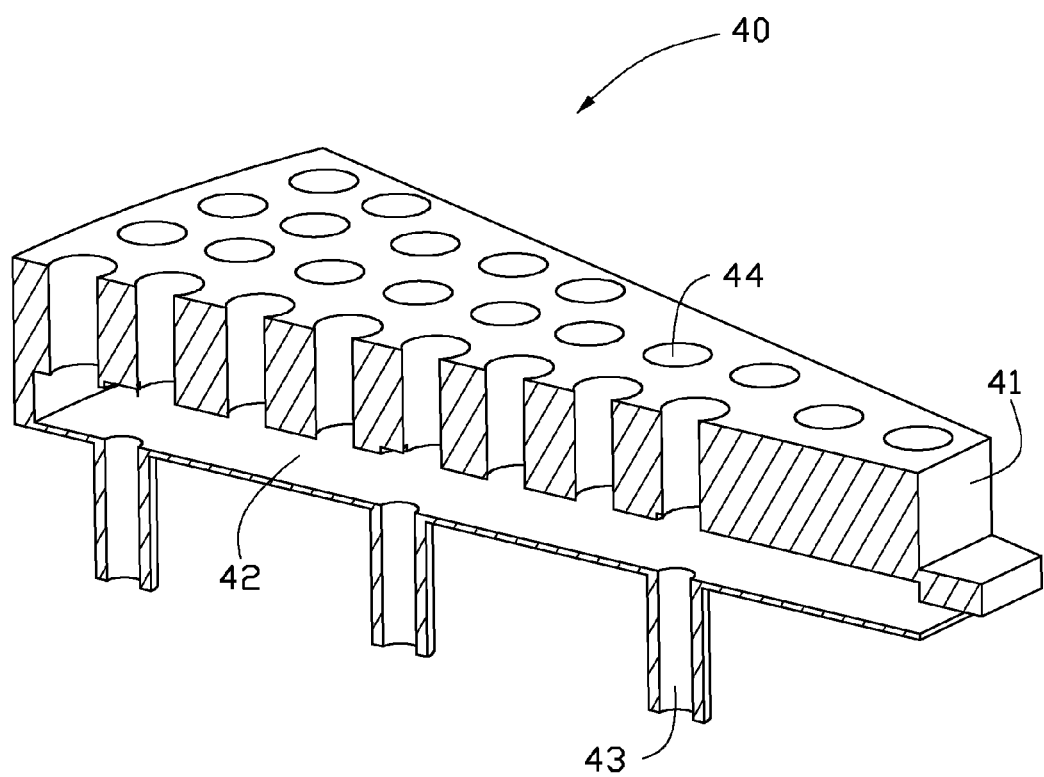
FIG. 5 shows an isometric, cross sectional view of one of the gas carrier boards in FIG. 1.

Referring to FIG. 5, each gas carrier board 40 includes a substantially hollow sector body 41 defining an inner chamber 42. A plurality of gas inlet tubes 43 are formed on a bottom surface of the sector body 41 communicating with the inner chamber 42. A plurality of gas outlet holes 44 are evenly defined through a top surface of the sector body 41, communicating with the inner chamber 40. In use, the gas inlet tubes 43 are connected with the second gas inlet 113, such that the protective gas from the gas providing system 80 is capable of being transmitted into the inner chamber 42 of the gas carrier boards 40, and evenly ejected out toward the plasma jet area P from the gas outlet holes 44. In the illustrated embodiment, the gas inlet tubes 43 are cylindrical and the number of the gas inlet tubes 43 is three. The number of the gas inlet tubes 43 may be only one, or two, or more than three.

The film material provider 50 is assembled within the film deposition chamber 10 and positioned adjacent to the plasma jet area P, for providing film particles (no shown). In use, the film particles are melted by the plasma jet ejected from the plasma generator 20 and deposited on the workpieces together with plasma jet thereby forming a plasma film on the workpieces. In the illustrated embodiment, the film material provider 50 is a film material evaporator source.

In use, the workpieces are positioned by being mounted and placed into the mounting holes 32 of the rotating support bracket 30, a surface of each workpiece faces the plasma generator 20. The gas providing system 80 inputs working gas into the housing 26 of plasma generator 20 by first gas inlet 111, and inputs the protective gas into the film deposition chamber 10 by means of the second gas inlet 113. The plasma generator 20 begins working, the cathode 23 and the anode 24 of the plasma generator 20 ionize the working gas into a high-temperature plasma. The magnetic field coil 25 drives and accelerates the ionized high-temperature plasma so as to eject from the spraying opening 21 to form a plasma jet aimed towards the plasma jet area P and the rotating support bracket 30. Meanwhile, the film material provider 50 sprays film particles toward the plasma jet area P. The film particles are melted by the plasma jet and deposited on the one or more surfaces of the workpieces mounted on the rotating support bracket 30 together with the plasma jet to form a plasma film on the workpieces. In one embodiment, the workpiece is made of silicon dioxide material, the working gas is argon, and the protective gas is selected from a group consisting of argon, oxygen, or a mixture of argon and oxygen. During the film deposition process, the shape of the plasma jet area P is adjustable by adjusting the gas carrier boards 40, according to the actual need, for changing the gas flow rate or direction of the protective gas. FIGS. 1 and 2 show two different working states of the gas carrier boards 40. As shown in FIG. 1, the gas carrier boards 40 radiate around the plasma generator 20. All the gas carrier boards 40 are perpendicular to the plasma generator 20, and form a circular ring surrounding the plasma generator 20. As shown in FIG. 2, the gas carrier boards 40 are tilted up relative to the plasma generator 20.

While various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A plasma film deposition device comprising:
   a film deposition chamber;
   a plasma generator assembled within the deposition chamber;
   a plurality of gas carrier boards adjustably mounted to the plasma generator and circumferentially surrounding the plasma generator;
   a gas providing system connected with the plasma generator and the gas carrier boards, for providing working gas to the plasma generator and providing protective gas to the gas carrier boards; and
   a rotating support bracket rotatably assembled within the film deposition chamber, and positioned above and aligning with the plasma generator, for positioning a plurality of workpieces;
   wherein, the plasma generator is capable of ionizing the working gas into high-temperature plasma, and sprays the high-temperature plasma toward the rotating support bracket thereby forming plasma films on the workpieces; the rotating support bracket and the plasma generator cooperatively define a plasma jet area, the gas carrier boards eject the protective gas toward the plasma jet area thereby adjusting a shape of the plasma jet area.

2. The plasma film deposition device of claim 1, wherein the plurality of gas carrier boards are evenly mounted to a peripheral wall of the plasma generator along a radial direction of the plasma generator, the gas carrier boards capable of being titled up and down on the plasma generator and remaining at a preset angle relative to the plasma generator.

3. The plasma film deposition device of claim 1, wherein each gas carrier board comprises a sector body defining an inner chamber, a plurality of gas inlet tubes formed on a bottom surface of the sector body to communicate with the inner chamber, and a plurality of gas outlet holes defined through a top surface of the sector body to communicate with the inner chamber; the gas inlet tubes are connected with the gas providing system.

4. The plasma film deposition device of claim 3, wherein the film deposition chamber comprises a bottom wall, a top wall opposite to the bottom wall, and a peripheral wall positioned between the bottom wall and the top wall; the rotating support bracket is rotatably mounted to the top wall; the plasma generator is mounted on the bottom wall and connected with the gas providing system.

5. The plasma film deposition device of claim 4, wherein the plasma generator comprises a housing, a cathode, an anode and a magnetic field coil assembled within the housing; the housing comprises a top end facing toward the rotating support bracket, and an opposite bottom end mounted on the bottom wall, the top end of the housing defines a spraying opening facing the rotating support bracket, the cathode and the anode are capable of generating high-pressure electric power to ionize the working gas; the magnetic field coil is for accelerating the ionized high-temperature plasma and ejecting the plasma from the spraying opening, to form a high-temperature plasma jet toward the rotating support bracket.

6. The plasma film deposition device of claim 5, wherein the rotating support bracket is substantially dome shaped and rotatably assembled to the top wall by a rotating shaft, the rotating shaft is coaxial with the plasma generator; a spraying density and a thickness of the plasma sprayed on the workpieces are adjustable by rotating the rotating support bracket.

7. The plasma film deposition device of claim 1, further comprising a film material provider assembled within the film deposition chamber and positioned adjacent to the plasma jet area, for providing film particles, wherein the film particles are melted by the plasma jet ejected from the plasma generator and deposited on the positioned workpieces together with plasma jet thereby forming plasma films on the positioned workpieces.

8. The plasma film deposition device of claim 7, wherein the film material provider is a film material evaporator source.

9. The plasma film deposition device of claim 5, wherein the peripheral wall defines a vacuum pumping port, the plasma film deposition device further comprises an outer vacuum extractor connected to the vacuum pumping port, for vacuum extracting the film deposition chamber.

10. A plasma film deposition device comprising:
    a film deposition chamber comprising a bottom wall, a top wall opposite to the bottom wall, and a peripheral wall;
    a rotating support bracket rotatably assembled to the top wall and received within the film deposition chamber, for assembling a plurality of positioned workpieces;
    a plasma generator assembled within the deposition chamber and positioned under the rotating support bracket, the plasma generator defining a spraying opening aligning with the rotating support bracket;
    a plurality of gas carrier boards adjustably mounted to the plasma generator and circumferentially surrounding the plasma generator;

a gas providing system connected with the plasma generator and the gas carrier boards, for providing working gas to the plasma generator and providing protective gas to the gas carrier boards; and wherein, the plasma generator is capable of ionizing the working gas into high-temperature plasma, and sprays the high-temperature plasma toward the rotating support bracket by the spraying opening, and finally forms plasma films on the positioned workpieces; a plasma jet area is defined between the rotating support bracket and the plasma generator, the gas carrier boards eject the protective gas toward the plasma jet area thereby changing and adjusting a shape of the plasma jet area.

11. The plasma film deposition device of claim 10, wherein the plurality of gas carrier boards are evenly mounted to the peripheral wall of the plasma generator along a radial direction of the plasma generator, the gas carrier board are capable of being titled up and down on the plasma generator and remain at a preset angle relative to the plasma generator.

12. The plasma film deposition device of claim 11, wherein each gas carrier board comprises a sector body defining an inner chamber, a plurality of gas inlet tubes formed on a bottom surface of the sector body to communicate with the inner chamber, and a plurality of gas outlet holes defined through a top surface of the sector body to communicate with the inner chamber; the gas inlet tubes are connected with the gas providing system.

13. The plasma film deposition device of claim 12, wherein the plasma generator comprises a housing, a cathode, an anode and a magnetic field coil assembled within the housing, the housing comprises a top end facing toward the rotating support bracket, and an opposite bottom end mounted on the bottom wall, the top end of the housing defines a spraying opening facing toward to the rotating support bracket, the cathode and the anode are capable of generating high-pressure electric power to ionize the working gas; the magnetic field coil is for accelerating the ionized high-temperature plasma and ejecting the plasma from the spraying opening, to form a high-temperature plasma jet toward the rotating support bracket.

14. The plasma film deposition device of claim 10, further comprising a film material provider assembled within the film deposition chamber and positioned adjacent to the plasma jet area, for providing film particles, wherein the film particles are melted by the plasma jet ejected from the plasma generator and deposited on the positioned workpieces together with plasma jet thereby forming plasma films on the positioned workpieces.

* * * * *